US005612234A

United States Patent [19]

Ha

[11] Patent Number: 5,612,234
[45] Date of Patent: Mar. 18, 1997

[54] METHOD FOR MANUFACTURING A THIN FILM TRANSISTOR

[75] Inventor: Yong M. Ha, Kyungki-do, Rep. of Korea

[73] Assignee: LG Electronics Inc., Seoul, Rep. of Korea

[21] Appl. No.: 539,156

[22] Filed: Oct. 4, 1995

[51] Int. Cl.⁶ .................................................. H01L 21/265
[52] U.S. Cl. .................................. 437/40; 437/44; 437/43
[58] Field of Search ................................. 437/44, 40, 41, 437/43

[56] References Cited

U.S. PATENT DOCUMENTS 5,430,320   7/1995   Lee .......................................... 257/412

FOREIGN PATENT DOCUMENTS 158970   9/1983   Japan ........................................ 437/44
220971  12/1984   Japan ........................................ 437/44

OTHER PUBLICATIONS

Y. Yamamoto et al., "High Performance Low Temperature Poly-Si TFT with Self-Aligned Offset Gate Structure by Anodic Oxidation of Al for a Driver Monolithic LCDs", ASIA Display 1995, pp. 941–942.

Kobayashi et al., "A Novel Fabrication Method for Polycrystalline Silicon Thin-Film Transistors with a Self-Aligned Lightly Doped Drain Structure", Jpn. J. Appl. Phys., 32(1, 1B):469–473 (1993).

Primary Examiner—Tuan H. Nguyen
Attorney, Agent, or Firm—Finnegan, Henderson, Farabow, Garrett & Dunner, L.L.P.

[57] ABSTRACT

A thin film transistor for incorporation into an active-matrix liquid crystal display includes an active layer provided on a substrate. An electrode insulating layer is formed on the active layer, and a gate electrode including first and second gate layers is provided on the electrode insulating layer. The second gate layer overlies the first gate layer and has a width greater than the first gate layer. LDD regions, self-aligned with the second gate layer are provided in the active layer adjacent source and drain regions. The active layer further including a channel region located under the first gate layer and offset regions located under portions of the second gate layer extending beyond the first gate layer at opposite sides of the channel region. In the manufacture of the thin film transistor, an active layer is formed on a substrate; electrode insulating layer is formed on the active layer; oxidizable first gate electrode and a non-oxidizable second gate electrode of the same widths are stacked on the electrode insulating layer; low-concentration impurity ions are implanted in the active layer using the second gate electrode as a mask; sides of the first electrode, to form oxide layers that reduce the width of the first gate electrode; and implanting high-concentration impurity ions, using the second gate electrode and the oxide layers as implantation masks.

21 Claims, 9 Drawing Sheets

METHOD FOR MANUFACTURING A THIN FILM TRANSISTOR

BACKGROUND OF THE INVENTION

The present invention relates to an active matrix liquid crystal display having an improved thin film transistor (TFT) and related manufacturing method.

Figure 1:
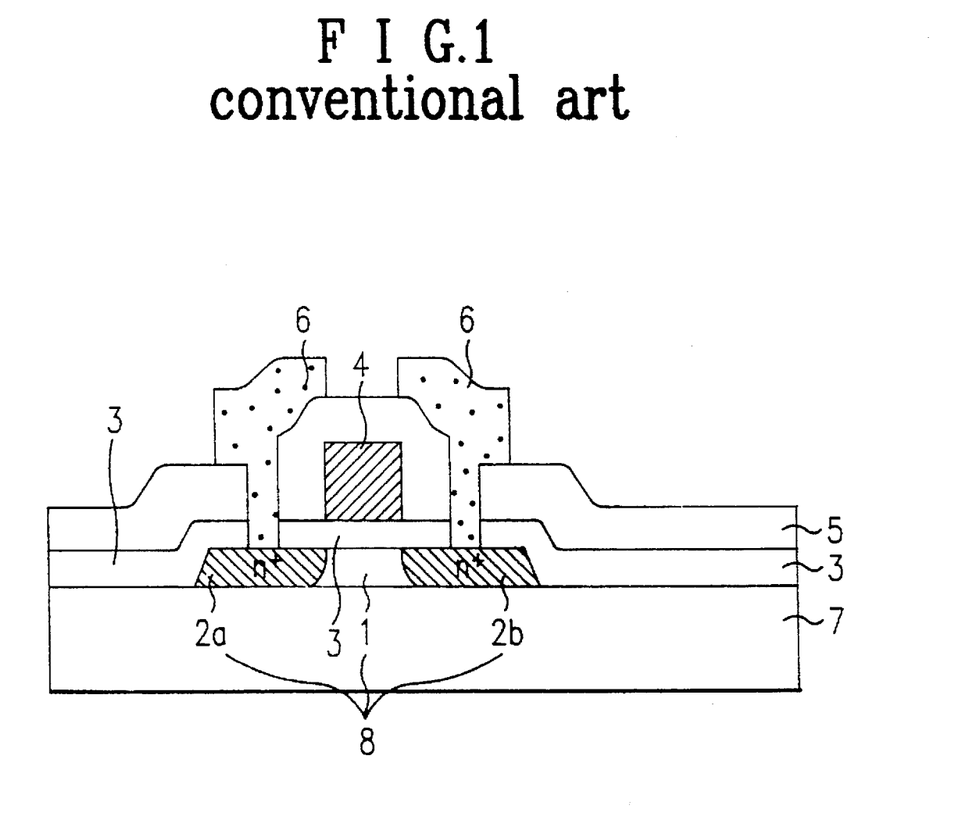
FIG. 1 is a sectional view of a conventional top gate type thin film transistor (TFT)

FIG. 1 illustrates a cross-sectional view of a conventional top gate-type TFT. In fabricating this kind of device, high impurity concentration source and drain regions 2a and 2b, respectively, are formed by ion implanting n or p conductivity type impurities using a gate electrode of the TFT as an implantation mask. As a result, the source and drain regions of the top gate-type TFT are said to be "self-aligned" with the gate electrode because the relative positions of the source and drain regions are determined by the gate electrode.

The self-aligned process used to fabricate the device shown in FIG. 1 is advantageous because it does not require any additional implantation masks, other than the gate electrode, to form source and drain regions 2a and 2b. Further, the self-alignment technique simplifies the overall manufacturing process because the source and drain regions are provided without additional photolithographic masking steps.

As shown in FIG. 1, the top gate-type TFT includes a channel region 1 between source region 2a and drain region 2b in polysilicon active layer 8. Active layer 8 and gate electrode insulating layer 3 are provided on substrate 7. Contact electrodes 6 are provided in contact holes through interlevel insulating film 5. In the TFT of FIG. 1, gate electrode 4 of the TFT overlies the entire length of channel region 1 and no portion of active layer 8 separates the source and drain regions 2a and 2b, respectively, from channel region 1.

Figure 2:
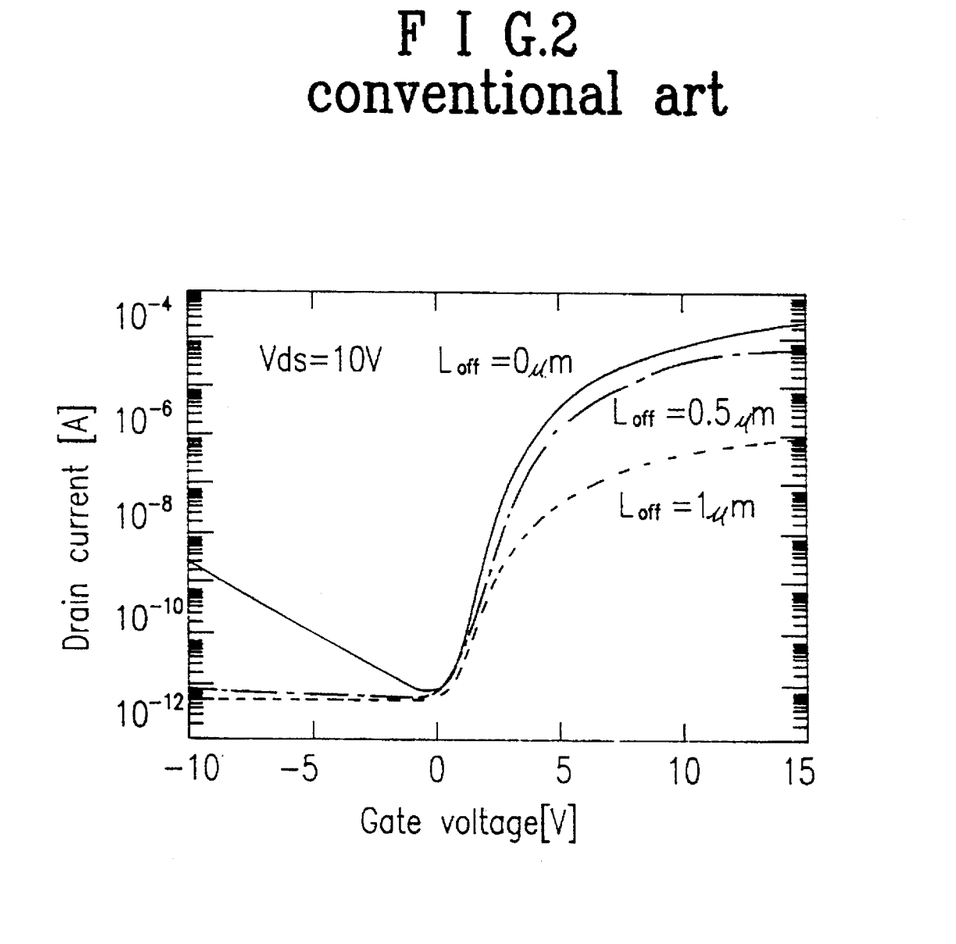
FIG. 2 is a graph showing variations in electrical characteristics of a TFT resulting from changes in offset region length.

The device shown in FIG. 1, however, can be fabricated with offsets or undoped regions separating the source and drain from the channel region. FIG. 2 is a graph illustrating drain current as a function of gate voltage for TFTs having offset lengths Loff of 0 microns, 0.5 microns and 1 micron, respectively.

The solid curve in FIG. 2 corresponds to the drain current characteristics of the conventional polysilicon TFT of FIG. 1. These leakage currents are due to electric field enhanced tunneling through traps in the drain junction. The leakage currents are generated even though the gate-source bias is negative, corresponding to the off-state of the TFT. Further, the leakage currents increase exponentially with increasingly negative gate-source voltage.

If the TFT shown in FIG. 1 is used as a switching device for driving pixels in a liquid crystal display, the signal voltage of the display will not be accurately maintained due to these high leakage currents. Consequently, flickering is observed in the liquid crystal display.

In order to solve these problems, a technique for forming lightly doped drains (LDDs) has been proposed. The LDD structure includes low-concentration impurity regions which are provided between the high impurity concentration drain region and the channel, as well as the high impurity concentration source region and the channel. The LDD is formed by providing additional masking steps and ion implantation processes.

Alternatively, undoped offset regions may be provided between the source/drain and the channel instead of LDD regions.

A conventional manufacturing process for fabricating a TFT having LDD or offset regions will be explained below with reference to FIGS. 3A to 3G.

Figure 3A:
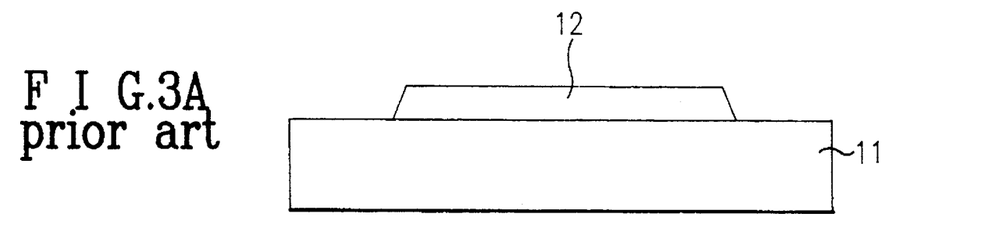
FIGS. 3A–3G are cross-sectional views showing manufacturing steps for making a conventional TFT having LDD or offset regions.
Figure 3B:
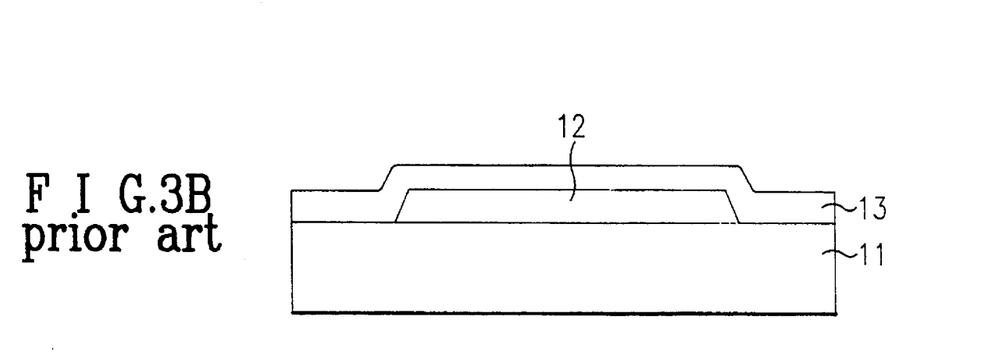
Figure 3C:
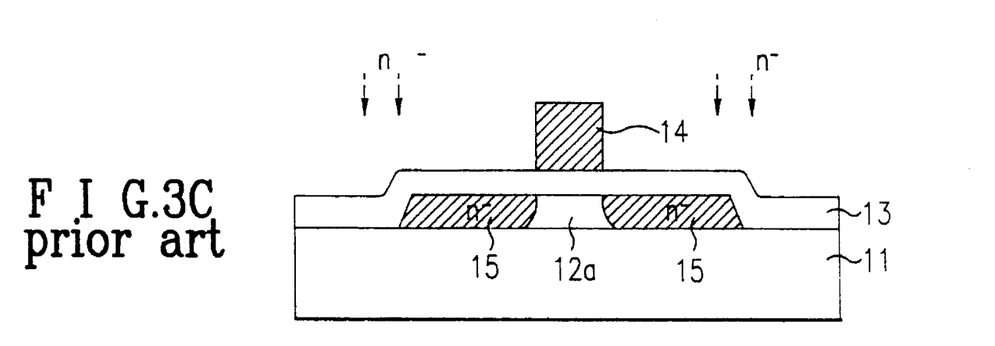

As shown in FIG. 3A, active layer 12 is formed by patterning a thin-film of polysilicon on a substrate 11 using photolithographic and etching processes. FIG. 3B illustrates formation of gate insulating layer 13 on exposed portions of substrate 11 and active layer 12. Next, as shown in FIG. 3C, a metallic or doped polysilicon layer is provided on gate insulating layer 13 and patterned to form gate electrode 14.

LDD regions 15 are then formed by implanting n conductivity type impurity ions through gate insulating layer 13 into active layer 12 using gate electrode 14 as an implantation mask. If undoped offset regions are desired, however, the ion implantation step should be omitted.

Figure 3D:
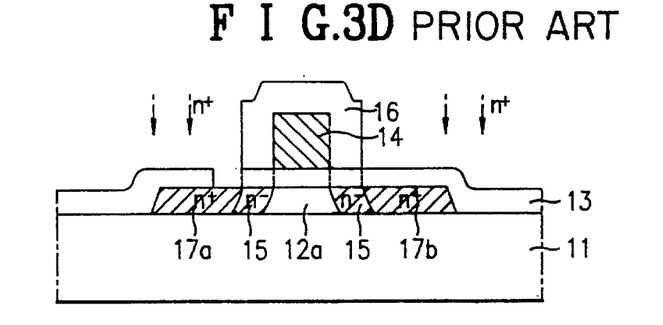
Figure 3E:
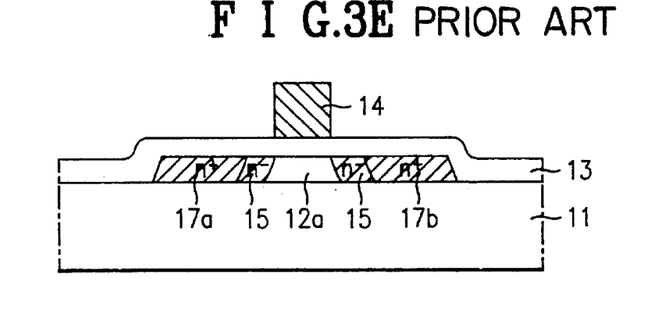
Figure 3F:
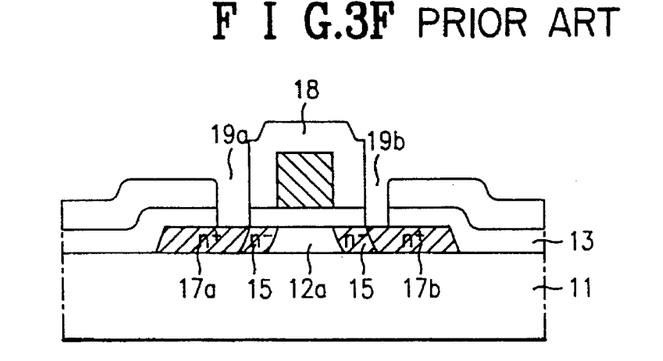

In FIG. 3D, a masking insulating layer 16 (for instance, a photoresist layer) is provided on exposed surfaces of gate electrode 14 and gate insulating layer 13. Then, the insulating layer 16 is patterned to cover gate electrode 14 and LDD regions 15. Using the patterned insulating layer 16 as an ion-implantation mask, a high concentration of n conductivity type (n+) impurity ions are implanted into active layer 12 through gate insulating layer 13 to form source and drain regions 17a and 17b, respectively. As shown in FIG. 3E, insulating layer 16 is removed and, in FIG. 3F, an interlevel insulating layer 18 is formed on the entire exposed surface of gate electrode 14 and gate insulating layer 13. The interlevel insulating layer 18 and gate insulating layer 13 are then patterned to form contact holes 19a and 19b over portions of source and drain regions 17a and 17b, respectively.

Figure 3G:
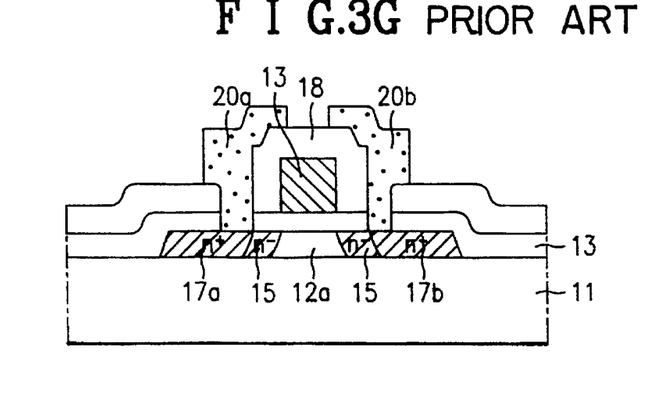

As shown in FIG. 3G, a metal layer is deposited on the entire upper exposed surface of the interlevel insulating layer 18 and in contact holes 19a and 19b. The metal layer is then patterned to form contact electrodes serving as source electrode 20a and drain electrode 20b in contact holes 19a and 19b, respectively. The resulting structure shown in FIG. 3G includes a channel region 12a located under gate electrode 14 in active region 12.

However, the conventional TFT of FIG. 3G having LDD regions or offset regions has the following problems. As noted above, the LDD or offset regions are formed by patterning insulating layer 16 prior to implanting a low dose of impurities. The patterning is achieved by photolithographic processes in which a layer of photoresist is exposed with a desired pattern using a mask aligner. A device patterned properly will have a suitable characteristic as shown by the dot-dash line in FIG. 2.

Alignment errors generally occur, however, making it difficult to obtain the desired length of the LDD or offset region. If the length of the LDD or offset region is too short, a high leakage current flows in the drain region when the TFT is turned off. Thus, in order to fully suppress leakage current, the length of the LDD or offset region should be designed to be longer than the desired length.

If the length of the LDD or offset region significantly exceeds the desired value, however, drain on-current is reduced to an unacceptable level because the electrical resistance between the channel and source or drain increases significantly. Such a device is not suitable even though it has reduced leakage currents when it is turned off (see dotted line in FIG. 2).

Accordingly, the above described problems associated with conventional TFTs bring about non-uniformities in device characteristics across the substrate from manufacturing run to manufacturing run and from device to device.

When the TFT is employed in a liquid crystal display, these nonuniformities deteriorate display performance and quality.

SUMMARY OF THE INVENTION

Therefore, it is an object of the present invention to provide an improved thin film transistor having reduced leakage current.

It is another object of the present invention to provide an improved method of manufacturing a thin film transistor in which self-aligned offset or LDD structures are formed uniformly and with high reproducibility and without additional masking steps.

A further object of the present invention is to provide an active-matrix liquid crystal display having an improved thin film transistor and related method.

In order to achieve the above objects, a semiconductor device is provided in accordance with the present invention, which comprises a semiconductor region having a gate electrode insulative layer formed thereon. A conductive layer is provided on the insulative layer, which has a conductive layer edge, and a portion of the semiconductor region below the conductive layer has a portion edge substantially in correspondence with said conductive layer edge. A first doped region is provided in the semiconductor region having a first impurity concentration. A second doped region is provided having a second impurity concentration, with the second impurity concentration being less than the first impurity concentration. The second doped region is formed adjacent the first region and spaced from the portion edge.

Further in accordance with the present invention, a method for fabricating a semiconductor device is provided comprising the steps of: forming a semiconductor layer; forming an insulative layer on said semiconductor layer; forming a first gate layer on said insulative layer; forming a second gate layer on said first gate layer; patterning said first and second gate layers so that said first gate layer has a width substantially the same as a width of said second gate layer; introducing a first amount of first impurities into said semiconductor layer using said first and second gate layers as a mask; oxidizing an edge of said first gate layer to the exclusion of said second gate layer; and introducing a second amount of second impurities into said semiconductor layer using said oxidized edge of said first gate layer as a mask, said second impurity amount having greater than said first impurity amount.

DETAILED DESCRIPTION OF THE PREFERRED EMBODIMENTS

Hereinafter, preferred embodiments of the present invention will be described with reference to the attached drawings.

Preferably, gate electrodes of TFTs for use in large active-matrix liquid crystal displays should be made of a conductor having a low electrical resistance. In accordance with a preferred embodiment of the present invention, therefore, low resistance metals such as aluminum, tantalum, aluminum-tantalum, molybdenum, and aluminum-molybdenum are preferably used as gate electrode materials. An additional property of these materials, however, which makes them suitable for use in the present invention, is that they are readily oxidized, preferably by anodization. Accordingly, either one side or opposite sides of the gate electrode can be anodized to form one or more insulating layers. Using the insulating layers as implantation masks, self-aligned LDD and offset regions can be formed in the active region. The present invention will now be described in detail with reference to the following illustrative first and second embodiments.

First embodiment

The first illustrative embodiment of a TFT in accordance with the present invention will be described with reference to FIG. 4G. The TFT includes a transparent insulative substrate 31 having a polysilicon active layer 32 formed thereon. Active layer 32 includes LDD regions 32a and offset regions 32e between source and drain regions 32b, 32c and channel region 32d. The channel region constitutes a region beneath a first gate layer 34 having edge portions 32f, 32g that are in substantial aligned correspondence with edges 34a and 34b of first gate layer 34. The LDD region 32a are spaced from edge portion 32f, 32g of the channel region 32d by offset region 32e. Further, offset regions 32e are in substantial aligned correspondence with edges 34a, 34b of first gate layer 34. LDD regions 32a and offset regions 32e are provided between source and drain regions 32b, 32c and channel region 32d. Insulating layers 33 and 37 are provided on the entire substrate except for contact holes 38a and 38b respectively providing vias for source and drain metal contacts 39a and 39b.

The gate electrode has a double layer structure including a first gate layer 34 and a second gate layer 35 of a width greater than the first gate layer. Oxide layers 36a and 36b are provided on opposite sides of first gate layer 34 on gate electrode insulating layer 33. LDD regions 32e are self-aligned with edges of the second gate electrode, while source and drain regions 32b and 32c, respectively, are self-aligned with edges of oxide layers 36a and 36b, respectively. In addition, portions of the second gate layer 35 extend beyond first gate layer 34 and overlap offset regions 32a. A passivation layer 40 is further provided over the entire device.

Since large alignment tolerances are required in fabricating the TFT device, reduced drain current would be expected, as discussed above. In accordance with the preferred embodiment shown in FIG. 4G, however, drain current is increased when the device is on. This is because, when a gate voltage is applied to the second gate layer during the device on-state, inversion occurs to a limited extent in the offset regions underlying portions of the second gate layer 35. As a result, increased drain current is observed.

When the device is turned off, however, the LDD and offset regions spread out the electric field adjacent the drain, thereby reducing leakage current.

Figure 4A:
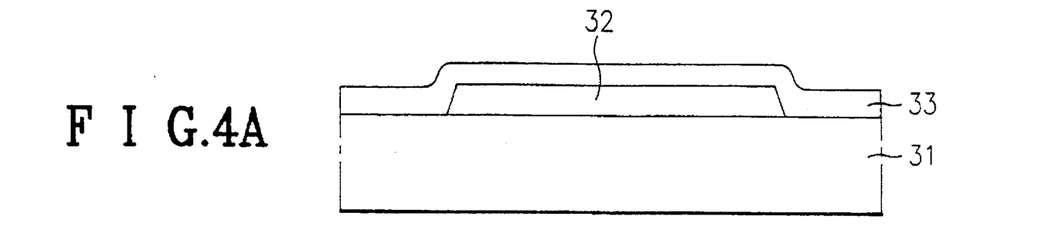
FIGS. 4A–4G are cross-sectional views of process steps for making a TFT having self-aligned LDD and offset regions in accordance with a first embodiment of the present invention.
Figure 4B:
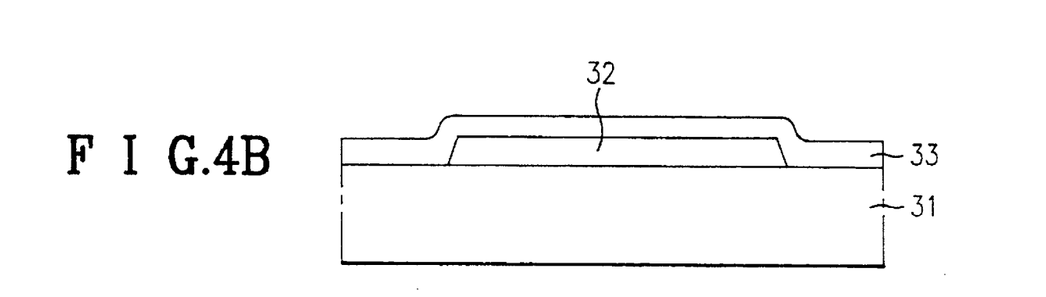
Figure 4C:
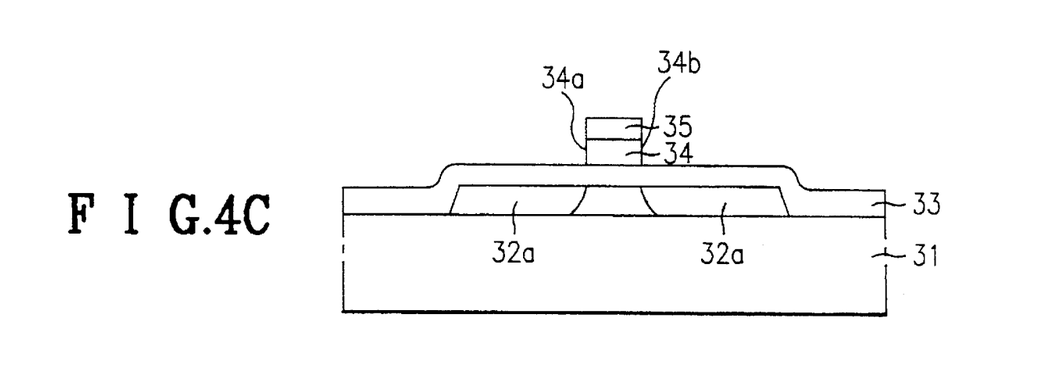

A method for manufacturing the device shown in FIG. 4G will now be discussed with reference to FIGS. 4A–4G. First, as shown in FIG. 4A, polysilicon is formed on a transparent insulating substrate 31 and patterned, using photolithographic and etching processes, to form active layer 32. In FIG. 4B, a silicon oxide layer or silicon nitride layer is formed, as a gate electrode insulating layer 33, over the exposed surfaces of active layer 32 and insulating transparent substrate 31. With reference to FIG. 4C, preferably, the first gate electrode 34 is formed on electrode insulating layer 33 to a thickness of 2,500 Å (angstroms). The second gate electrode 35 is then deposited on the first gate electrode to a thickness of 1,000 Å. Preferably, metals such as aluminum, tantalum, molybdenum, aluminum-molybdenum and aluminum-tantalum are used as an oxidizable conductor for the first gate electrode, while chrome is preferably used as a non-oxidizable conductor for the second gate electrode.

In this embodiment, other oxidizable materials, however, can be used for the first gate electrode 34, such as impurity doped polysilicon. Further, the second gate electrode 35 can be made of non-oxidizing materials other than chrome. For example, the second gate electrode 35 can include insulators such as silicon dioxide, silicon nitride, a photosensitive material such as a photoresist, or a semiconductor material.

The first and second gate electrode conductors are sequentially deposited as layers over the entire surface on gate electrode insulating layer 33 and preferably patterned to form first and second gate electrodes 34 and 35, respectively, having the same width. Although the first and second gate electrodes 34 and 35 are formed separately, they function as a single gate electrode.

Figure 4D:
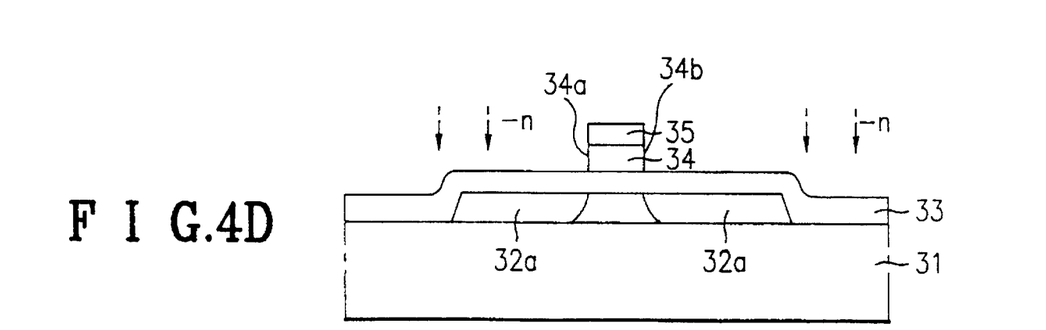

As shown in FIG. 4D, LDD regions 32a are preferably formed by implanting n or p type impurity ions at low doses of $0–10^{14}/cm^2$ into active layer 32 using second gate electrode 35 as an ion-implanting mask. Either an ion implanter or ion doping device may be used in this step. Thus, resulting LDD regions are provided in portions of active layer 32 not covered by first gate electrode 34.

Figure 4E:
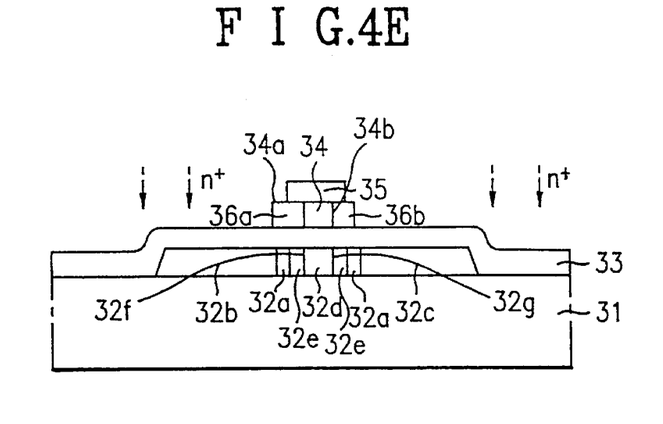

As further shown in FIG. 4E, anodization is performed to oxidize exposed opposite side portions of first gate electrode 34, thereby to form oxide layers 36a and 36b. If first gate electrode 34 is made of aluminum, the anodization is preferably performed by immersing the substrate in an acid bath such as ammonium succinate, ammonium tartrate, or ammonium adipate and applying a current source to the gate electrode layers to form layers 36a and 36b of $Al_2O_3$. However, no oxide is formed on second gate electrode 35 because it is formed of a non-oxidizable material such as chrome. The width of oxide layers 36a and 36b is determined by controlling the current applied during the anodization and the duration of the anodization. Preferably, oxide layers 36a and 36b have a width in the range of 1,000–10,000 Å (angstroms).

The anodization bath is generally very corrosive and may cause portions of the second gate layer to erode away. In which case, it is preferable to provide a protective layer, such as an insulator on the second gate layer and pattern it along with the first and second gate layers. Then, during the anodization step the second gate layer is kept intact.

As further shown in FIG. 4E, when opposite sides of first gate electrode 34 are oxidized during the anodization process, the width of the first gate electrode 34 will be reduced because a certain amount of the first gate electrode is consumed by the oxide in the following reaction. Oxide layers 36a and 36b, however, will extend horizontally beyond second gate electrode 35. Therefore, the second gate electrode 35 will cover the entire surface of first gate electrode 34 and part of oxide layers 36a and 36b.

In order to form high impurity concentration source and drain regions, impurity ions are implanted into active layer 32 through gate electrode insulating layer 33 using an ion implanter. During the ion implantation, oxide layers 36a and 36b provided on opposite sides of first gate electrode 34 and second gate electrode 35 serve as implantation masks. Accordingly, high impurity concentration regions are formed in portions of active layer 32 not covered by second gate electrode 35 and oxide layers 36a and 36b, as shown in FIG. 4E. If desired, the second gate electrode may then be removed after the implantation.

At this point in the manufacturing process in accordance with the present invention, active region 32 has been sectioned to include a channel region 32d located under first gate electrode 34 and having a reduced width due to the above described anodization process; offset regions 32e are provided on opposite sides of channel region 32d beneath portions of oxide layers 36a and 36b covered by second gate electrode 35; LDD regions (or low-concentration impurity regions) 32a are located on opposite sides of offset regions 32e under a portion of oxide layers 36a and 36b not covered by second gate electrode 35; and source and drain regions (or high-concentration impurity regions) 32b and 32c are located on both sides of LDD regions 32a.

Figure 4F:
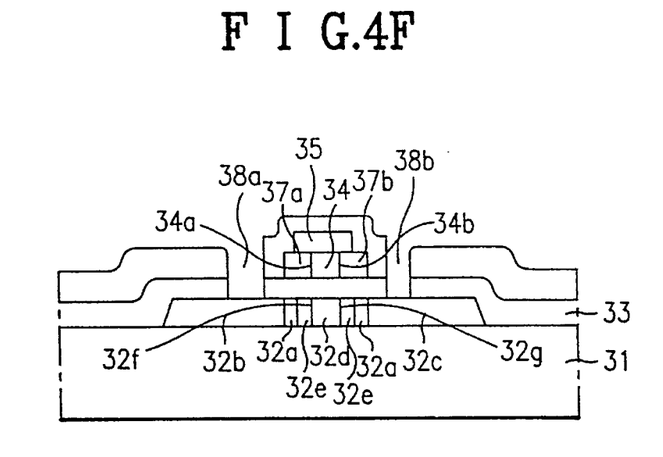

Next, FIG. 4F illustrates formation of interlevel insulating layer 37, in which a silicon oxide layer is deposited to a thickness of 5,000 Å (angstroms) on the exposed surfaces of the oxide layers 36a and 36b, second gate electrode 35 and remaining portions of gate electrode insulating layer 33. The silicon oxide layer and gate electrode insulating layer 33 are then patterned to form contact holes 38a and 38b serving as contact vias for high-impurity concentration source and drain regions 32b and 32c, respectively.

Figure 4G:
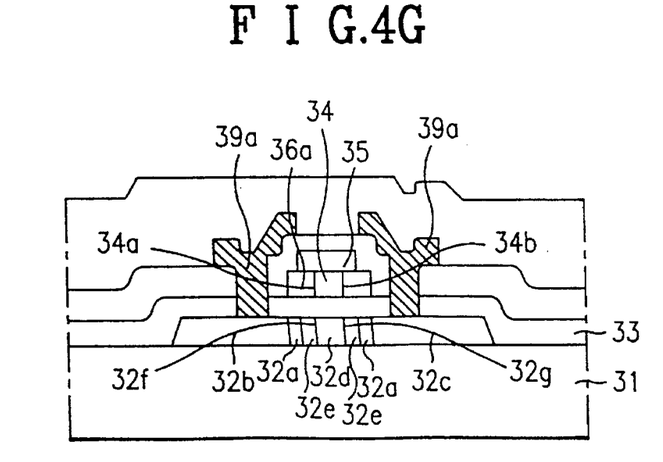

As shown in FIG. 4G, contact wires or electrodes (i.e., source and drain electrodes), are formed by depositing a metal such as aluminum or other conductive material over the entire surface of interlevel insulating layer 37 and into contact holes 38a and 38b. Preferably, the metal is deposited to a thickness of 5,000 Å (angstroms) and then patterned to form contact electrodes 39a and 39b occupying contact holes 38a and 38b, respectively. A passivation insulating layer 40, such as a silicon oxide layer, is then deposited on the entire exposed surface of the contact electrodes 39a and 39b and interlevel insulating layer 37.

The resulting TFT shown in FIG. 4G can be used either as a pixel switching device in an active-matrix liquid crystal display or in a static random access memory (SRAM).

Figure 5:
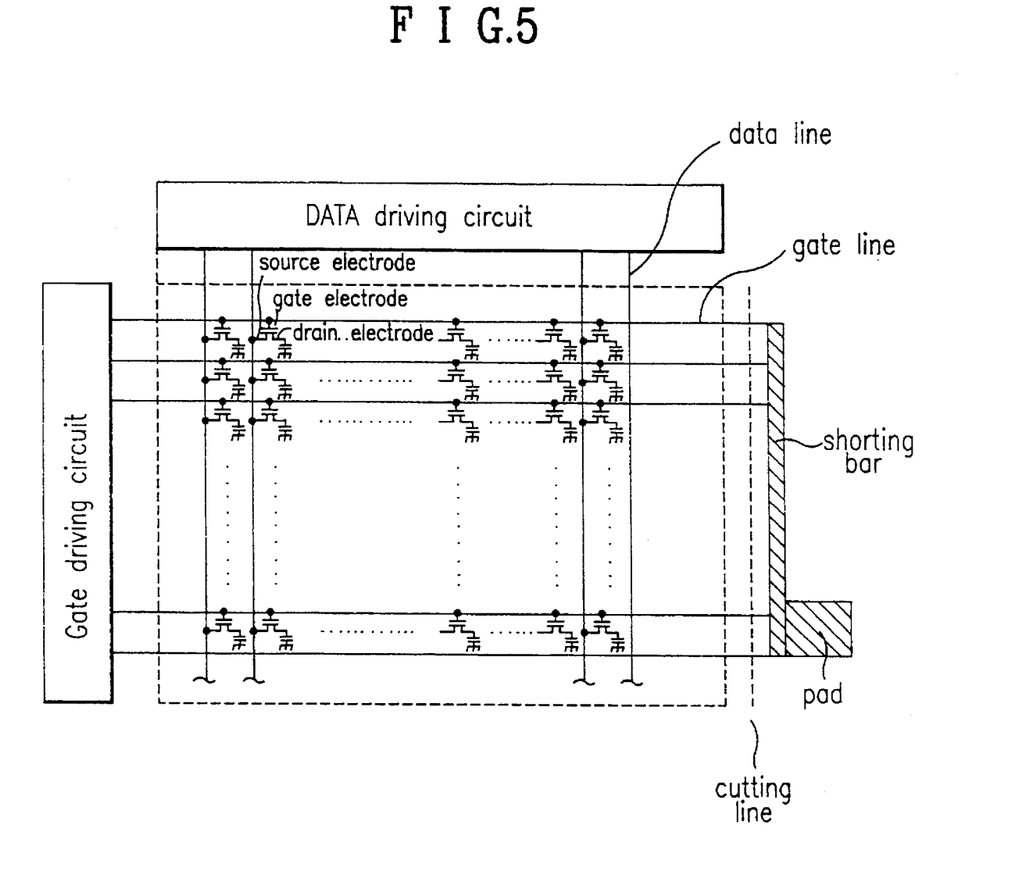
FIG. 5 is a schematic diagram of an active-matrix liquid crystal display in accordance with an embodiment of the present invention.

FIG. 5 illustrates an example in which the TFTs made in accordance with the process steps illustrated in FIGS. 4A–4G are employed as switching devices in an active-matrix liquid crystal display that typically includes a plurality of gate lines and data lines. As seen in FIG. 5, each of the gate lines are connected to plural electrodes extending therefrom and each of the data lines are connected to plural contact electrodes (or source or drain electrodes) of the TFTs.

As disclosed, in order to anodize the two sides of the first gate electrode 34, the structure of FIG. 4D must be placed in an electrolytic solution and a current source must be applied to the gate electrodes for the oxidation to occur. For convenience, the current varying current should flow from the gate lines to an electrolytic solution simultaneously during the anodization step.

Thus, in accordance with the present invention, a shorting bar, serving as an anodization electrode, and having an anodization electrode pad is provided in common connection to the front ends of the gate lines. The growth rate of $Al_2O_3$ is determined by the value of current flowing through the, electrolytic solution, and the final thickness of $Al_2O_3$ is limited by maximum voltage of the current source.

The shorting bar may be formed in the same step that the gate lines are formed, or as a separate component in a different step. After anodization, the shorting bar is removed along a cutting line shown in the drawing, using, for example, scribing, photoetching, or laser cutting techniques.

The LDD and offset regions of the TFT shown in FIG. 4G reduce the intensity of the electric field applied to the drain region when the TFT is turned off. As noted previously, a feature of the first embodiment is that it includes offset regions, which are self-aligned with respect to the oxide layers 36a and 36b, and LDD regions, which are self aligned to the first and second gate electrodes prior to anodization.

If the length of the LDD and offset regions is too long, the ON current of the TFT would be expected to be reduced significantly, as discussed above with reference to FIG. 2. However, in the first embodiment of the present invention, since the concentration of carriers is high while the TFT is ON due to the second gate electrode having a broader width than the first gate electrode and having a portion extending over the offset regions, the ON current is not reduced significantly.

Second embodiment

As stated above, a feature of the present invention is to form, in a self-alignment method, LDD and offset regions for reducing the leakage current produced in the drain while the TFT is OFF, and increasing drain current while the TFT is ON.

As discussed before, since the problems associated with the conventional TFT result from leakage current in the drain region, offset regions adjacent the source region are not always required. Thus, in accordance with the second embodiment of the present invention, the TFT has its offset regions only in the drain region.

Figure 6A:
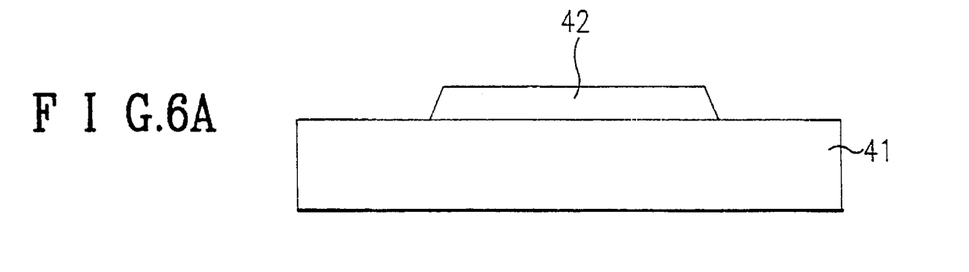
FIGS. 6A–6H are sectional views of a second embodiment of the present invention illustrating the process of manufacturing a TFT having LDD and offset regions.
Figure 6B:
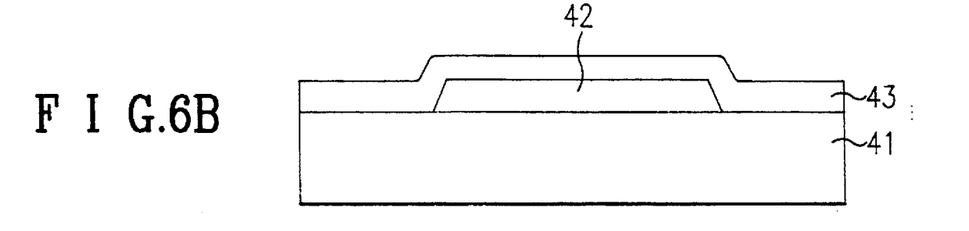
Figure 6C:
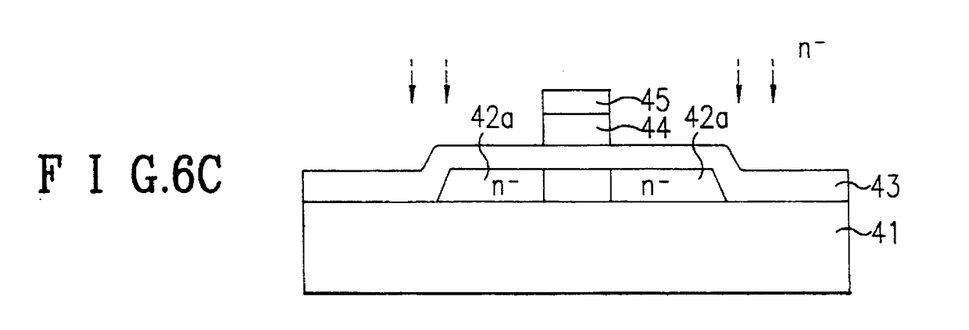
Figure 6D:
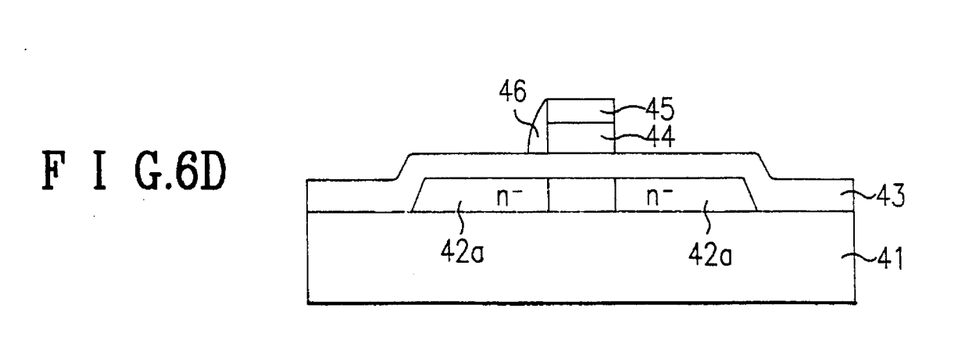
Figure 6E:
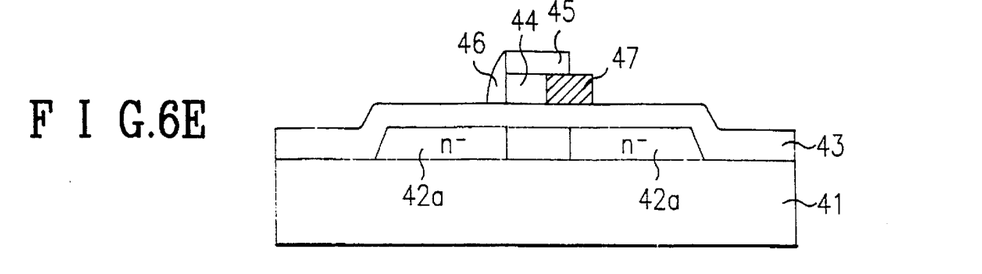
Figure 6F:
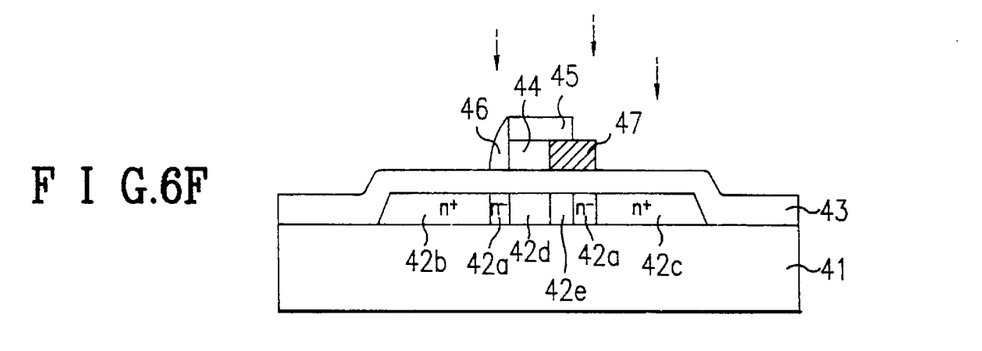
Figure 6G:
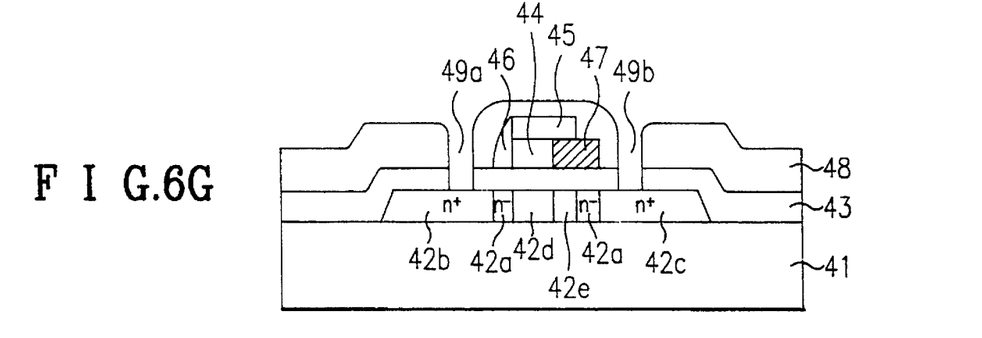
Figure 6H:
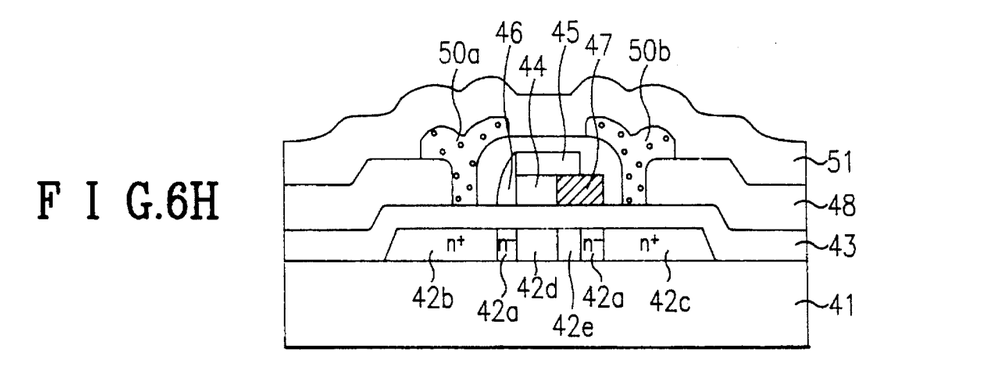

The TFT in accordance with the second embodiment is shown in FIG. 6H. This device is similar to the device shown in FIG. 4G, with the exception that it includes a sidewall spacer 46 so that anodizing only occurs on one side of the first gate layer 44. Further no offset region is provided on the source side of the channel region 42d. The device shown in FIG. 6H enjoys the same advantages as the TFT shown in FIG. 4G, but it is asymmetric, whereas the device depicted in FIG. 4G is symmetrical.

The second embodiment of the manufacturing process of a TFT having LDD and offset regions will be explained with reference to FIGS. 6A–6H.

First, as shown in FIG. 6A, polysilicon is formed on an insulating transparent substrate 41 and patterned to form active layer 42. Next, as shown in FIG. 6B, a silicon oxide layer or silicon nitride layer is deposited as a gate electrode insulating layer 43 over active layer 42 and exposed portions of insulating transparent insulating substrate 41.

Referring to FIG. 6C, an oxidizable conductor, corresponding to the first gate electrode, is deposited over the entire surface of gate electrode insulating layer 43 to a thickness of 2,500 Å (angstroms), and preferably a nonoxidizable conductor is then deposited on the oxidizable material to a thickness of 1,000 Å (angstroms).

Subsequently, the oxidizable and nonoxidizable layers are patterned to form first and second gate electrodes 44 and 45, respectively. The first and second gate electrodes 44 and 45 are separate layers but function as a single gate electrode in the same manner as in the first embodiment.

In order to form LDD regions in active layer 42, impurity ions are implanted at relatively low doses over the entire exposed surface of gate electrode insulating layer 43 using second gate electrode 45 as an ion-implantation mask. Either an ion implanter or an ion doping device may be used to introduce the impurities into active layer 42.

As a result, LDD regions 42a are formed in active layer 42 with the exception of portions located under first gate electrode 44.

As shown in FIG. 6D, an insulating layer is next deposited over the exposed surface of first gate electrode 44, second gate electrode 45 and electrode insulating layer 43. The insulating layer is then patterned to form a sidewall spacer 46 only on one of the two sides of first gate electrode 44 and second gate electrode 45.

As illustrated in FIG. 6E, anodizing is performed by oxidizing only one side of the first gate electrode 44 not covered by sidewall spacer 46. Accordingly, an oxide layer 47 is formed only on the exposed side of gate electrode 44 and not on second gate electrode 45 because, as noted previously, it is formed of a non-oxidizing material. Further, the width of the first gate electrode 44 will be reduced because a portion of gate electrode 44 is consumed to create oxide layer 47 during the anodization. The oxide layer thus formed will extend horizontally beyond the second gate electrode 45 an the oxidized side of first gate electrode 44. Therefore, the second gate electrode 45 will cover the entire top surface of first gate electrode 44 and a portion of oxide layer 47.

In FIG. 6F, in order to form high-impurity concentration source and drain regions, a high dose of impurity ions is implanted into active layer 42 through gate electrode insulating layer 43, preferably with an ion implanter. Oxide layer 47 and sidewall spacer 46 formed on the other side of first and second gate electrode 44 and 45, respectively, are used as ion-implantation masks during this step. Accordingly, a high concentration of impurity ions are implanted into portions of active layer 42 not covered by second gate electrode 45, oxide layer 47 and sidewall spacer 46, thereby forming high impurity concentration source and drain regions 42b and 42c, respectively.

As a result, active layer 42 is processed to include channel region 42d, located under first gate electrode 44, of a reduced width due to the above-described anodization process. In addition, offset region 42e is provided on one side of channel region 42d beneath a first portion of oxide layer 47 covered by second gate electrode 45. In addition, one of LDD regions 42a is provided beneath a second portion of oxide layer 47 not covered by second gate electrode 45, and the other LDD region 42a is formed under sidewall spacer 46. Further, source and drain regions 42b and 42c are located adjacent respective LDD regions 42a.

Next, in FIG. 6G, if desired, the sidewall spacer 46 may be removed for implanting the high dose of impurity ions. A silicon oxide interlevel insulating layer 48 is deposited to a thickness of 5,000 A (angstroms) over the entire exposed surfaces of gate electrode insulating layer 43, sidewall spacer 46, oxide layer 47 and second gate electrode 45. This silicon oxide layer is then patterned to form contact holes 49a and 49b to provide contact vias for high-impurity concentration source and drain regions 42b and 42c, respectively.

As shown in FIG. 6H, for contact electrodes (or source and drain electrodes), a suitable metal, such as aluminum, is deposited into contact holes 49a and 49b and on interlevel insulating layer 48 to a thickness of 5,000 A (angstroms). The metal deposited is then patterned to form contact electrodes 50a and 50b filling contact holes 49a and 49b. A passivation insulating layer 51, such as a silicon oxide layer, is next deposited over exposed surfaces of the contact electrodes 50a and 50b and interlevel insulating layer 48, resulting in the TFT structure shown in FIG. 6H.

In the same manner as the first embodiment, the TFT manufactured in accordance with the process shown in FIGS. 6A–6H can be used in an SRAM. Materials for respective components and manufacturing process steps are the same as those of the first embodiment.

In summary, the present invention has the following advantages.

First, the desired length of the offset and LDD regions can be precisely controlled, thereby reducing leakage current in the drain region during the OFF state of the TFT and preventing a reduction of drain current during the ON state of the TFT.

Second, the LDD or offset regions are formed by a self-alignment method without an additional masking step requiring an aligner, the entire manufacturing process is simplified, and yields are improved.

Third, since the LDD and offset regions are created using a self-aligned process, when a great number of TFTs are produced, uniformity and reproducible device characteristics are achieved from lot to lot. Further, since the desired length of the offset regions can be obtained precisely, the TFTs in accordance with the present invention enjoy enhanced reliability.

Fourth, if the TFT is used as a component in an active-matrix liquid crystal display or SRAM, the display efficiency and operation efficiency of the display is improved.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a semiconductor device comprising the steps of:

forming a semiconductor layer;

forming an insulative layer on said semiconductor layer;

forming a first gate layer on said insulative layer;

forming a second gate layer on said first gate layer;

patterning said first and second gate layers so that said first gate layer has a width substantially the same as a width of said second gate layer;

introducing a first amount of first impurities into said semiconductor layer using said first and second gate layers as a mask, thereby forming a doped region in said semiconductor layer;

oxidizing an edge of said first gate layer to the exclusion of said second gate layer, thereby reducing a width of said first gate layer; and introducing a second amount of second impurities into said semiconductor layer using said oxidized edge of said first gate layer as a mask, said second amount is greater than said first amount, wherein said reduced width of said first gate layer defines a gate underlying region in said semiconductor layer, and said doped region is spaced from said gate underlying region in said semiconductor layer.

2. A method in accordance with claim 1, wherein said first and second impurities are the same.

3. A method in accordance with claim 1, wherein said oxidizing step further includes a step of anodization.

4. A method in accordance with claim 1, wherein said step of introducing said first amount of first impurities includes a step of ion implanting said first impurities into said semiconductor layer.

5. A method in accordance with claim 1, wherein said step of introducing said first amount of first impurities includes a step of ion doping said first impurities into said semiconductor layer.

6. A method in accordance with claim 1, wherein said step of introducing said second amount of second impurities includes a step of ion implanting said second impurities into said semiconductor layer.

7. A method in accordance with claim 1, wherein said step of introducing said second amount of second impurities includes a step of ion doping said second impurities into said semiconductor layer.

8. A method of manufacturing a thin film transistor comprising the steps of:

forming an active layer on a substrate;

forming an gate insulating layer on said active layer;

forming a gate electrode having an oxidizable first gate layer of a first width on said gate insulating layer and a non-oxidizing second gate layer of a second width equal to the first width of said first gate layer;

implanting impurity ions of a first dose using said second gate layer as a mask to thereby form a first plurality of impurity regions in said active layer of a first concentration;

oxidizing a first side of said first gate layer to form a first oxide layer and a second side of said first gate layer opposite said first side of said first gate layer to form a second oxide layer, thereby to reduce a width of said first electrode; and implanting impurity ions of a second dose using said second electrode and said first and second oxide layers as an implantation mask to form a second plurality of impurity regions in said active layer, said second plurality of impurity regions having a second concentration greater than said first concentration, wherein said reduced width of said first gate layer defines a gate underlying region in said active layer, and said first plurality of impurity regions each being spaced from said gate underlying region in said active layer.

9. A method of manufacturing a thin film transistor in accordance with claim 8, wherein said substrate is a transparent insulative substrate.

10. A method of manufacturing a thin film transistor in accordance with claim 8, wherein said step of oxidizing said first and second sides of the first gate layer includes an anodizing process.

11. A method of manufacturing a TFT in accordance with claim 10, further comprising the steps of:

connecting said gate electrode to a gate line;

coupling an end of said gate line to a shorting bar;

performing said anodizing using said shorting bar as an anodization electrode; and removing said shorting bar after said anodizing.

12. A method of manufacturing a thin film transistor as claimed in claim 8, wherein said first and second plurality of impurity regions have a conductivity type selected from a group of n and p.

13. A method of manufacturing a thin film transistor in accordance with claim 8, wherein said first dosage is selected from a range of $0-10^{14}/cm^2$.

14. A method of manufacturing a thin film transistor in accordance with claim 8, wherein said oxidizable material is selected from a group including aluminum, tantalum and aluminum-tantalum, molybdenum, and aluminum-molybdenum.

15. A method of manufacturing a thin film transistor in accordance with claim 8, wherein said second gate layer includes non-anodizing material.

16. A method of manufacturing a thin film transistor in accordance with claim 15, wherein said non-anodizing material is selected from a group including chrome, semiconductor, silicon oxide, silicon nitride and a photosensitive layer.

17. A method of manufacturing a thin film transistor in accordance with claim 8, further comprising the steps of:

forming an interlevel insulating layer on said gate electrode insulating layer, said first oxide layer, said second oxide layers and said second gate electrode;

patterning said interlevel insulating layer and gate insulating layer to form a plurality of contact holes respectively extending to each of said second plurality of impurity regions;

forming and patterning a conductive layer in said plurality of contact holes; and forming a passivation insulating layer on said patterned interlevel insulating layer and said patterned conductive layer.

18. A method of manufacturing a thin film transistor comprising the steps of:

forming an active layer on a substrate;

forming an gate insulating layer on said active layer;

forming a gate electrode including an oxidizable first gate layer of a first width on said gate insulating layer and a non-oxidizable second gate layer of a second width equal to the first width of said first gate layer;

implanting impurity ions at a first dose using said second electrode as a mask, to thereby form a first plurality of impurity regions of a first concentration in said active layer;

forming a sidewall spacer against a first side of said first gate layer and a side of said second gate layer;

oxidizing a second side of said first gate layer opposite said first side to form an oxide layer, thereby reducing the first width of said first electrode; and implanting impurity ions at a second dose using said second electrode and said oxide layer as an implantation mask to form a second plurality of impurity regions in said active layer of a second concentration greater than said first concentration, wherein said reduced first width of said first gate layer defines a gate underlying region in said active layer, and said first plurality of impurity regions each being spaced from said gate underlying region in said active layer.

19. A method of manufacturing a thin film transistor in accordance with claim 18, wherein said oxidization of the second side of said first gate layer uses an anodization process.

20. A method of manufacturing a thin film transistor in accordance with claim 18, further comprising the step of removing said sidewall spacer.

21. A method of manufacturing a TFT in accordance with claim 19, further comprising the steps of:

connecting said gate electrode to a gate line;

coupling an end of said gate line to a shorting bar;

performing said anodizing process using said shorting bar as an anodization electrode; and removing said shorting bar after said anodizing process.

\* \* \* \* \*